United States Patent [19]
Morton

[11] 3,939,798
[45] Feb. 24, 1976

[54] OPTICAL THIN FILM COATER

[75] Inventor: Dale E. Morton, Farmers Branch, Tex.

[73] Assignee: Texas Instruments Incorporated, Dallas, Tex.

[22] Filed: Dec. 19, 1974

[21] Appl. No.: 534,327

[52] U.S. Cl. .................................. 118/7; 118/49.1
[51] Int. Cl.² .................... B05C 11/02; C23C 13/12
[58] Field of Search ............ 118/48, 49, 49.1, 49.5, 118/50.1, 8, 7; 427/34, 35, 162, 163, 255, 294, 402

[56] References Cited
UNITED STATES PATENTS

| | | | |
|---|---|---|---|
| 2,391,595 | 12/1945 | Richards et al. ...................... | 118/49 |
| 2,456,708 | 12/1948 | Kellogg ................................. | 118/49 |
| 3,608,519 | 9/1971 | Bean et al. ............................ | 118/48 |
| 3,636,916 | 1/1972 | Thelen et al. ......................... | 118/48 |
| 3,664,295 | 5/1972 | Ng et al. ............................... | 118/48 |

*Primary Examiner*—Mervin Stein
*Assistant Examiner*—Douglas Salser
*Attorney, Agent, or Firm*—Harold Levine; Rene' E. Grossman; Alva H. Bandy

[57] ABSTRACT

Disclosed is an improved optical thin film coating system comprising all essential elements of resistive and electron beam evaporation systems, chemical vapor deposition systems and reactive plasma deposition systems. Sequences of cleaning and deposition processes which previously required moving substrates through several chambers are performed in a single vacuum chamber. The evaporative sources also efficiently vaporize solid materials to provide reactive gases for reactive plasma and chemical vapor deposition processes, which were previously difficult or impossible to perform. Substrate movement, masking, and monitoring means previously used with evaporative sources are used to control thickness and uniformity of films deposited by chemical vapor and reactive plasma processes, to provide optical quality films.

8 Claims, 1 Drawing Figure

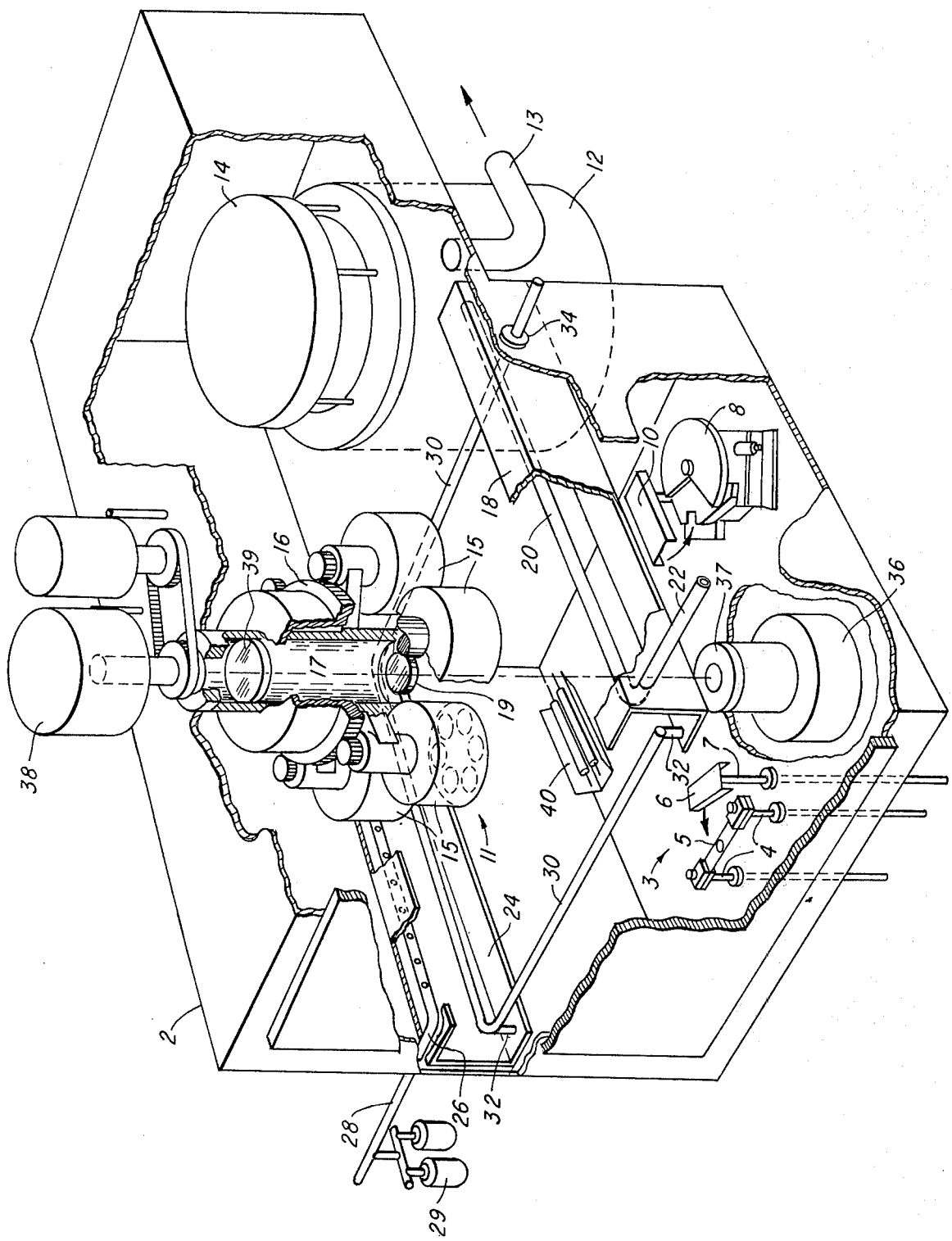

OPTICAL THIN FILM COATER

This invention relates to thin film deposition systems and more particularly to systems for deposition of optical quality thin films.

Highly transparent materials used as windows for IR and optical applications are often soluble, soft or fragile and require protective coatings before they may be exposed to atmospheric conditions. More durable window materials are available but generally have high indices of refraction and require antireflection coatings to increase transmittance. Many of the better antireflection coating materials are themselves soft, soluble or fragile and thus often require a mechanically protective coating to protect the antireflection coating. Since the thickness of any type of coating on an optical window determines its optical characteristics it is essential that the coating thickness be closely controlled and uniform over the surface of the window.

Only thin film deposition by resistive heating or electron beam evaporation techniques has been refined to the extent required to provide optical quality thin films. These refinements include planetary motion substrate holders for improving uniformity and monitors and substrate masks for controlling deposition thickness. But these evaporation techniques are limited to materials which can be easily evaporated and which do not decompose upon heating or which, if they do decompose, recombine reactively to form a suitable thin film coating. Many other materials are desirable as either antireflection coatings or mechanical protective coatings for optical windows but cannot be deposited by traditional evaporation techniques.

Two other thin film deposition processes, chemical vapor deposition, CVD, and reactive plasma deposition, RPD, are being used in general thin film deposition work. These processes are typically used in integrated circuit fabrication to provide coatings having improved durability or coatings of materials which cannot be deposited by evaporation. Both CVD and RPD have been used to deposit films with desirable optical properties but neither has been developed to provide the thickness uniformity and material homogeneity required in coating many optical components. Both of these processes produce a desired coating from one or more gases which either decompose or react chemically very close to the surface to be coated. In CVD heat from the surface to be coated causes the chemical reaction to occur. In RPD radio frequency energy is applied to the gas to cause it to decompose or react and the substrate surface may remain relatively cool. Both of these processes depend upon the availability of suitable gases which will react or decompose to produce the desired coating material. Alternatively, liquid or solid sources have been used by lowering the pressure in the reaction chamber and vaporizing the source by heat. Solid sources are difficult to use due to recondensation of the material before it reaches the substrate surfaces.

Optical coatings often include from ten to thirty layers of various materials including bonding layers for causing the optical layers to adhere to each other. If coating materials are selected according to optimum optical and mechanical characteristics there are many situations for which the selected materials can not be deposited by any single deposition system presently being used. Deposition of such a coating therefore requires that the substrate be moved from one chamber to another with resulting exposure to air and contaminants that degrade optical and mechanical properties of the coating. Alternatively the selection of coating materials may be limited to those which may be deposited in a single chamber. This approach necessarily prevents the use of some desirable materials and often results in the use of a larger number of layers to achieve the desired optical response. Thus, present multilayer antireflection coatings must either be limited to the materials which may be deposited in a single system or suffer degradations due to exposure to air between deposition of layers.

Accordingly, an object of the present invention is to provide an improved optical thin film deposition system.

Another object of the present invention is to provide a thin film deposition system which efficiently provides reactive gases from solid sources for chemical vapor deposition and reactive plasma deposition.

Still another object of the present invention is to provide a thin film coating system in which a plurality of materials may be co-deposited upon a substrate by means of evaporation, chemical vapor deposition and reactive plasma deposition techniques.

Yet another object of the present invention is to provide a thin film deposition system in which a plurality of materials may be deposited upon a substrate sequentially by means of evaporation, chemical vapor deposition and reactive plasma deposition techniques without removal of the substrate from a vacuum chamber.

Still yet another object of the present invention is to provide a thin film deposition system in which substrates may be cleaned by an in situ plasma etch process prior to any thin film deposition step.

Briefly stated the optical thin film deposition system of the present invention comprises a vacuum chamber, substrate support and movement means for improving deposition uniformity, thermal and electron beam means for vaporizing solid materials, substrate heating means, inlet and outlet baffles for providing a laminar gas flow across the surface of substrates, and an antenna for providing an RF field at the substrate surface. The evaporative sources are used to deposit thin films of the solid materials being vaporized or to provide gases for reaction with other gases in a RPD or CVD process. The baffles are used to provide a flow of reactive gases across the substrate surface for RPD and CVD processes, but do not interfer with evaporative deposition. The RF antenna is used to generate a RF field at the substrate surface for RPD. Substrate heaters are used to provide high substrate temperatures required for CVD and to provide optimum substrate temperatures for evaporative deposition and RPD. Reactive plasma cleaning is used prior to any sequence of depositions and depositions are performed in any sequence without breaking vacuum or removing substrates from the chamber.

Other objects, features and advantages of the invention will be more readily understood from the following detailed description when read in conjunction with the drawing which illustrates a thin film deposition system constituting the present invention.

The optical thin film deposition system as shown in the drawing includes a vacuum chamber 2 which may be, for example, a Balzers High Vacuum Corporation, Type BA k550. A resistive evaporation station 3 is included within the chamber. This station includes a pair of electrodes 4 extending through the bottom of the chamber in sealing relationship and a resistive heating boat 5 for holding solid materials to be evaporated. Suitable boats, for example, are those known in the art as filaments, point sources, baskets, crucible heaters and box sources sold by the R. D. Mathis Company of Long Beach, Ca. Also included with the resistive evaporation station is a shutter or mask 6 attached to a rotatable shaft 7 which extends through the bottom of the chamber. The mask 6 is positioned over the material in boat 5 prior to its evaporation to prevent contamination of the material by vaporized materials from other sources. Mask 6 is also used to control carefully the deposition thickness by being positioned over the source when a desired thickness has been reached. Also positioned on the bottom of chamber 2 is an electron beam evaporation source 8. This source 8 is controlled by connections passing through the bottom of chamber 2 in sealing relationship. Source 8 may be, for example, a Sloan Instruments Corporation multihearth electron beam gun Part No. 126-200. A mask or shutter 10 is also provided for source 8 and is used in the same way as mask 6. A heat source 40 such as an Airco Temescal Model HA-2 quartz heater assembly is also located on the bottom of chamber 2 and positioned to radiate heat toward the top of the chamber where substrates to be coated are located. This heater is used in evaporative deposition processes which require that the surface being coated be hot. A diffusion pump 12 is connected at the rear of chamber 2. A cryogenic baffle 14 covers the top of the opening into pump 12 to block the path of particles traveling from the pump back towards the chamber 2. A standard roughing pump is attached to outlet 13. The roughing pump removes the majority of gases from chamber 2 during a pump down sequence while the diffusion pump 12 provides and maintains high vacuum when needed. A substrate support and movement device 11 is attached to the top of the chamber above the resistive and electron beam evaporation stations 3 and 8. The surfaces to be coated are exposed at the bottom of this support device as is necessary in any optical coating system to prevent contamination by particles settling under the force of gravity. The preferred substrate support comprises six circular support members 15 geared to and driven around a larger circular member 16 to provide planetary motion for the substrates as they are coated. At the center of the planetary motion substrate support is a hollow vertical cylindrical shaft 17 with an optical monitor glass slide-covering the bottom of this shaft. A light source 36 provides a light beam through optical window 37 in the center of the bottom of chamber 2. The light beam travels up through the chamber to the optical monitor slide and can be transmitted through the hollow vertical shaft 17 in the substrate support out through an optical window 39 in the top of chamber 2 to a light detector 38 or reflected to a similar detector arrangement below the baseplate. The electrical output of detector 38 is functionally related to the thickness of material deposited on the optical monitor slide and is used to stop deposition when a desired thickness has been reached.

A gas inlet baffle 18 is attached to one side of the chamber 2 with the top of the baffle close to the substrates and substantially aligned with the plane of rotation of the substrates in the substrate supports 15. A perforated gas inlet line 20 is supported within baffle 18 with the perforations oriented to direct laminar gas flow horizontally across the chamber and the substrates. One end of gas inlet line 20 extends out through a wall of chamber 2 to form an input 22 for connection to a source of reactive gases. Where a mixture of reactive gases is needed for the deposition process and the gas cannot be mixed before being piped into the chamber, additional gas lines 20 and inlets 22 may be added to the baffle 18 as necessary. A screen or perforated cover may also be added to the open side of baffle 18 to improve laminar flow across the substrates and to aid in mixing of inlet gases when two or more inlet lines 20 are used. An exhaust baffle 14 is attached to a wall of the chamber 2 across from the inlet baffle 18 and at substantially the same height from the bottom of the chamber. A perforated exhaust line 26 is supported in exhaust baffle 24 and extends through an outlet 28 in the side of chamber 2 for connection to a high capacity vacuum pump 29. The location and shape of exhaust baffle 24 is not as important as that of inlet baffle 18 in providing a flow of gases across the substrate surfaces. The fact that baffle 24 is positioned on the opposite side of supports 15 increases the probability that gases from inlet tube 20 pass through a reactive zone near the substrate surfaces before being removed from the chamber. The gases react due to high substrate temperature (CVD) or due to an RF field applied via an antenna 30 mounted in the chamber (RPD). Baffles 18 and 24 also provide a convenient mounting for RF antenna 30.

The exhaust line outline 28 could be connected to a standard roughing pump and could replace the roughing pump outlet 13. In the preferred embodiment an additional pump 29 is employed to prevent contamination of the roughing pump by the ractive gases used in the CVD and RPD processes. The preferred pump 29 is sold under the trademark VacSorb by Varian Associates, Vacuum Division.

A U-shaped antenna 30 is supported on insulating stand offs 32 attached to the inside bottom surfaces of baffles 18 and 24. The plane of this antenna is parallel to and several inches below the plane of rotation of substrates in the substrate supports 15. One end of the antenna 30 is coupled to a feedthrough 34 in a wall of chamber 2 for connection to a source of radio frequency power.

The heater 40 previously described is used to heat substrates in supports 15 for CVD and RPD processes. Many standard heaters used for evaporative deposition steps provide sufficient heat for CVD processes. In the preferred embodiment additional quartz halogen lamp heaters 40 are used to supplement the standard heater and provide higher substrate temperatures for CVD steps.

In operation, this system may be used as an evaporative deposition system, a reactive plasma deposition system, or a chemical vapor deposition system or any combination of these. For example, material such as chrome and gold may be evaporated in the resistively heated boat 5 for deposition on the substrates. More refractory material may be placed in electron beam source 8 to be vaporized by a narrow electron beam being focused upon its surface. Materials which cannot be deposited from the standard evaporation sources such as boron nitride may be deposited by a reactive plasma deposition process.

To produce a boron nitride coating a gaseous mixture of, for example, diborane and ammonia is fed into the system through inlet tube 20. The gases flow across the chamber along the bottom surface of substrates in substrate supports 15 and are drawn out of the system by the vacuum pump 29 attached to exhaust tube 26. Since the vacuum chamber is operated at a low pressure the reactive gases fill the entire chamber but the positioning of the inlet and exhaust baffles provides a primary gas flow across the substrate surfaces. RF power from an external source is coupled through input 34 to antenna 30 to generate a radio frequency electric field between the antenna and the substrate supports 15 which are at ground potential. The RF energy generates a plasma from the diborane and ammonia gases to produce boron nitride which is deposited upon the exposed surfaces of the substrates. This and other RPD processes are disclosed in British Pat. No. 1,104,935 issued to Sterling and Swann. Similar deposition processes may be performed by heating the substrate surfaces with radiant heat from heater 40 and supplying a mixture of gases which react to form a coating material when they come in contact with the hot substrate surface.

Each of the above deposition processes could individually be performed in various prior art deposition systems. Other processes and sequences of processes which are performed in this system could not be performed in any single prior art deposition system. For example, plasma etch cleaning of substrates such as disclosed in U.S. Pat. No. 3,615,956 to Irving et al. is performed in this system before deposition of materials by any of the processes. This cleaning step is normally performed by feeding carbon tetraflouride gas into the inlet tube 20 while supplying RF energy to the antenna 30. The resulting plasma contains fourine ions which are highly reactive and very effectively clean all exposded surfaces. Other gases such as $O_2$ or HF can be used as required. The reactive plasma cleaning step may be followed by a resistive heater evaporation process without removal of the substrates from the chamber and without breaking the vacuum.

An example of a combination process which is performed in this chamber is the deposition of a thin film of zinc sulfide. Zinc sulfide is produced from zinc chloride, a solid, and hydrogen sulfide, a gas. The zinc chloride is placed in the resistive heating boat 5 and heated to generate zinc chloride gas. Hydrogen sulfide gas in argon diluent is fed into the chamber through inlet tube 20 and allowed to flow across the substrate surfaces. RF energy is coupled to antenna 30 to generate a plasma at the substrate surfaces. RF energy is coupled to antenna 30 to generate a plasma at the substrate surfaces. The hydrogen sulfide gas and vaporized zinc chloride react under the influence of the RF energy at the substrate surfaces and deposit a layer of zinc sulfide.

Another example is the fabrication of a multilayer antireflection coating. The improved antireflection coating of this example is used for high index of refraction windows, such as germanium, which are transparent in the infrared spectrum. In theory such a coating has only three layers comprising a sequence of high, medium and low refractive index materials. In the prior art only evaporative systems could provide optical quality films, but there is no suitable high index of refraction material which may be deposited by evaporation. The prior art solution to this problem was to use two coatings, a first layer of zinc sulfide and a second layer of germanium, as a substitute for the desired high refractive index layer. This double layer was then followed by layers of zinc sulfide and thorium fluoride. This four layer coating was deposited entirely in a single evaporative system. In the present invention a single layer of gallium arsenide deposited by RPD is used for the desired high index of refraction layer. The second layer is zinc sulfide and is deposited in a combination process as described above or may be deposited by evaporation as in the prior art process. The third layer is thorium flouride and is deposited by evaporation as in the prior art process.

The gallium arsenide layer is deposited by a standard RPD process. Arsine gas is bubbled through tetramethylgallium, a liquid, and is then coupled into the chamber through inlet tube 20. RF power coupled to antenna 30 generates a plasma in the gas to generate gallium arsenide from the reaction between the arsine and the tetramethylgallium carried into the chamber by the arsine.

It is also very desirable to place a protective coating on this antireflection coating. The boron nitride coating described above is suitable for this purpose and is deposited over the thorium flouride layer without removing the substrate from the chamber. Deposition of a protective coating on a prior art antireflection coating required exposure of the coating to the atmosphere as it was moved from an evaporative system to a RPD system since no suitable protective layer could be deposited by evaporation.

Thus, it is seen that the present invention provides an improved antireflection coating comprising the optimum three layers only and in addition provides a protective layer deposited before the antireflection coating has been exposed to any atmospheric contaminants.

Although the present invention has been shown and illustrated in terms of specific apparatus, it will be apparent that changes or modifications can be made without departing from the scope of the invention as defined by the appended claims.

What is claimed is:

1. An optical thin film deposition system comprising a vacuum chamber, evaporative deposition means within said chamber, reactive plasma deposition means within said chamber, chemical vapor deposition means within said chamber, a movable substrate support means within said chamber, and means for selectively activating the evaporative deposition means, the reactive plasma deposition means, and the chemical vapor deposition means whereby thin films are deposited upon a substrate by evaporative deposition, RPD, and CVD in any sequence or in combination without removal of the substrate between deposition of layers.

2. A deposition system according to claim 1 wherein said evaporative deposition means comprises:
   a resistive evaporation source within said chamber including a pair of electrodes extending through a wall of said chamber in sealing relationship for connection to a source of electrical power and a resistive heating element connected between said electrodes within said chamber, said heating element being shaped to hold materials to be vaporized.

3. A deposition system according to claim 1 wherein said evaporative deposition means comprises:
   an electron beam evaporation source within said chamber including an electron gun for providing an electron beam, support means for holding material to be vaporized by said beam, and control means coupled to said gun for activating said gun and for directing said beam onto the surface of material to be vaporized.

4. A deposition system according to claim 1 wherein said reactive plasma deposition means comprises:

reactive gas inlet means within said chamber including a baffle for directing a primary flow of inlet gases across said substrate support means, said inlet means coupled in sealing relationship through a wall of said chamber to a source of reactive gases, reactive gas exhaust means within said chamber for removing gases from the chamber after they have flowed across the substrate support, said exhaust means coupled through a wall of said chamber to a vacuum pump, and an antenna within said chamber spaced from said substrate support, said antenna coupled through a wall of said chamber to a source of radio frequency power for generating a radio frequency electrical field at the surface of said substrate support means.

5. A deposition system according to claim 4 wherein said chemical vapor deposition means comprises said reactive gas inlet means, said reactive gas exhaust means, and heating means within said chamber for heating the surface of the substrate support.

6. A deposition system according to claim 1 wherein said movable substrate support is positioned in the path of particles generated by said evaporative deposition means and is coupled to a source of mechanical power which drives the support on a planetary path.

7. An optical thin film deposition system comprising:

a vacuum chamber including at least one vacuum pump connected to said chamber for providing a preselected level of vacuum within said chamber;

a resistive evaporation source within said chamber including a pair of electrodes extending through a wall of said chamber in sealing relationship for connection to a source of electrical power and a resistive heating element connected between said electrodes within said chamber, said heating element being shaped to hold materials to be vaporized, an electron beam evaporation source within said chamber including an electron gun for providing an electron beam, support means for holding material to be vaporized by said beam, and control means coupled to said gun for activating said gun and for directing said beam onto the surface of material to be vaporized, a movable substrate support within said chamber for holding substrates to be coated in the path of particles generated by said resistive and electron beam evaporation sources and for moving said substrates to improve uniformity of deposition, reactive gas inlet means within said chamber including a baffle for directing a primary flow of inlet gases across the surface of said substrate support, said inlet means coupled in sealing relationship through a wall of said chamber to a source of reactive gases, reactive gas exhaust means within said chamber for removing gases from the chamber after they have flowed across the surface of the substrate support, said exhaust means coupled through a wall of said chamber to a vacuum pump, an antenna within said chamber spaced from the surface of said substrate support, said antenna coupled through a wall of said chamber to a source of radio frequency power for generating a radio frequency electrical field at the surface of said substrate support, and heating means within said chamber for heating the surface of the substrate support, said heating means coupled through a wall of said chamber to a source of electrical power.

8. In an optical thin film deposition system of the class having resistive and electron beam evaporative sources, a movable substrate support for holding substrates to be coated in a path of vaporized materials, source masking means for blocking the path of vaporized material in response to a monitor signal indicating a preselected deposition thickness, and substrate heating means for maintaining substrates at an elevated temperature during deposition, said sources, supports, masks, monitor, and heating means mounted in an evacuable chamber which is maintained at low pressure during deposition, the improvement comprising gas inlet means within said chamber and coupled to a source of gases outside said chamber, gas exhaust means within said chamber and coupled to a vacuum pump outside said chamber, said gas inlet and gas exhaust means being positioned to provide a flow of gases across the surface of the substrate support, and an antenna mounted in said chamber spaced from said substrate support and coupled to a source of radio frequency energy outside said chamber for providing an RF field at the surface of said support.

* * * * *